(12) United States Patent
Chen et al.

(10) Patent No.: US 6,459,751 B1
(45) Date of Patent: Oct. 1, 2002

(54) MULTI-SHIFTING SHIFT REGISTER

(75) Inventors: Hsing-Yi Chen, Hsin-Chu Hsien; Jo-Yu Wang, Hsin-Tien; Jyh-Ming Wang, Tu-Cheng; Hsin-Kuang Chen, Kaohsiung; Min-Shun Liao, Hsin-Chu, all of (TW)

(73) Assignee: Silicon Integrated Systems Corp., Hsin-Chiu (TW)

( * ) Notice: Subject to any disclaimer, the term of this patent is extended or adjusted under 35 U.S.C. 154(b) by 0 days.

(21) Appl. No.: 09/847,978

(22) Filed: May 2, 2001

(51) Int. Cl.[7] ............................................. G06M 3/00
(52) U.S. Cl. ............................. 377/26; 377/43; 377/78
(58) Field of Search ................................. 377/26, 43, 78

(56) References Cited

U.S. PATENT DOCUMENTS 6,061,417 A * 10/2000 Kelem ........................ 377/26

* cited by examiner

Primary Examiner—Margaret R. Wambach

(74) Attorney, Agent, or Firm—Townsend and Townsend and Crew LLP

(57) ABSTRACT

A multi-shifting shift register is adapted for outputting a selected address signal to a memory unit, and includes a control circuit for outputting a number (i) of shift signals and a timing pulse signal. One of the shift signals is at an enabled state and the other ones of the shift signals are at a disabled state during each cycle of the timing pulse signal. A multi-shifting circuit includes a number (N), which is larger than the number (i), of cascaded register units, each of which has a flip-flop that has an input end, and an output end for generating an address signal, and a selector that has the number (i) of select inputs for receiving the number (i) of the shift signals respectively from the control circuit, the number (i) of address signal inputs, and an output. The output end of the flip-flop is connected to a first one of the address signal inputs of the selector. The input end of the flip-flop of each of the register units is connected to the output of the selector of a preceding one of the register units. A $j^{th}$ one of the address signal inputs of the selector of each of the registers units is connected to the output end of the flip-flop of a $(j-1)^{th}$ preceding one of the register units. The number (j) is a number between 2 and i. The selected address signal is the address signal that is outputted by the flip-flop of one of the register units and that is at the enabled state.

3 Claims, 5 Drawing Sheets

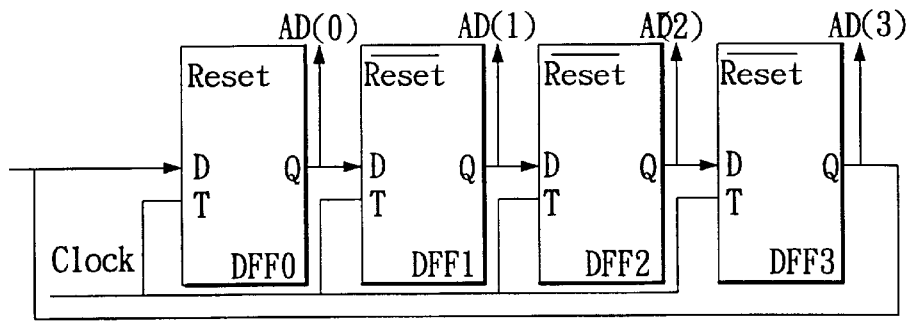
FIG. 1 PRIOR ART
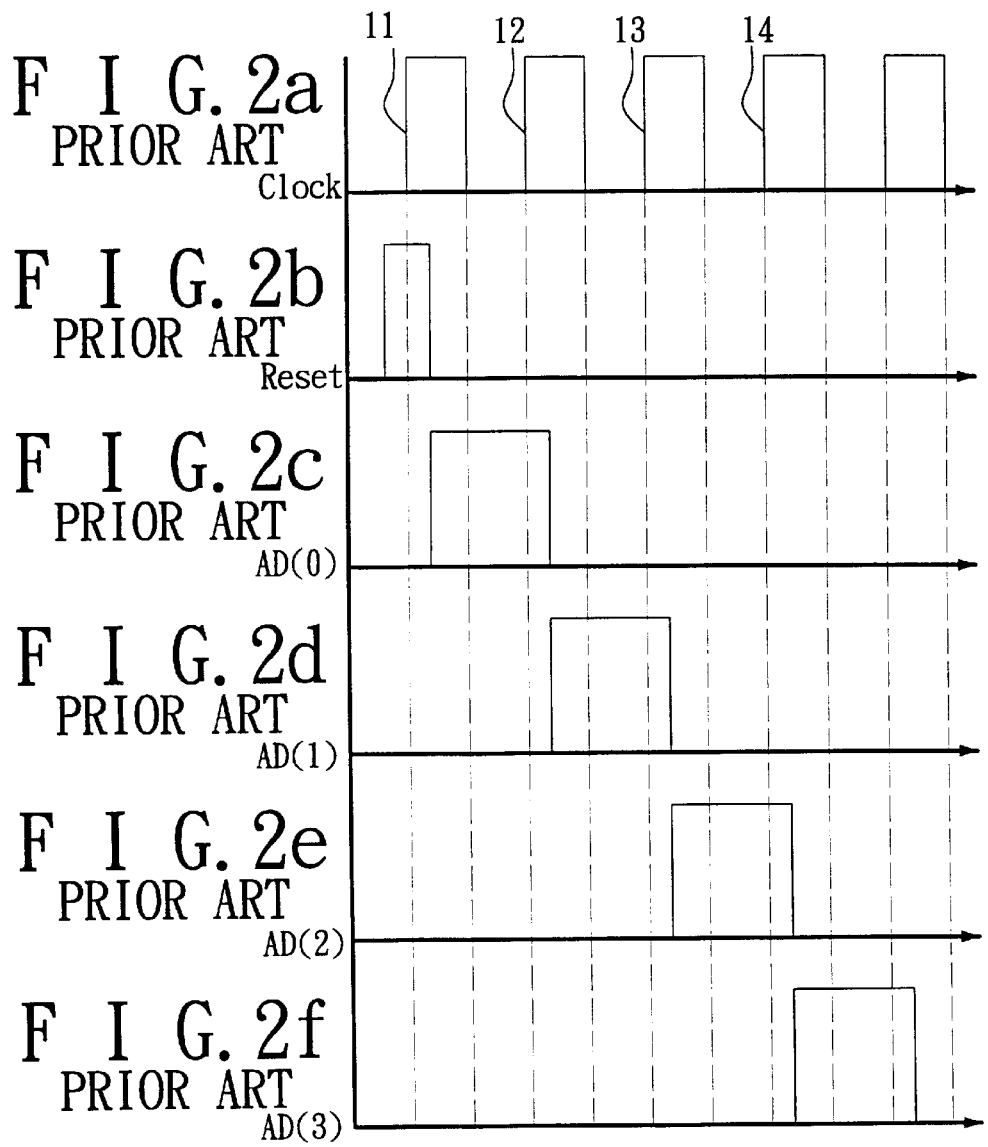
FIG. 2a PRIOR ART Clock
FIG. 2b PRIOR ART Reset
FIG. 2c PRIOR ART AD(0)
FIG. 2d PRIOR ART AD(1)
FIG. 2e PRIOR ART AD(2)
FIG. 2f PRIOR ART AD(3)

F I G. 4

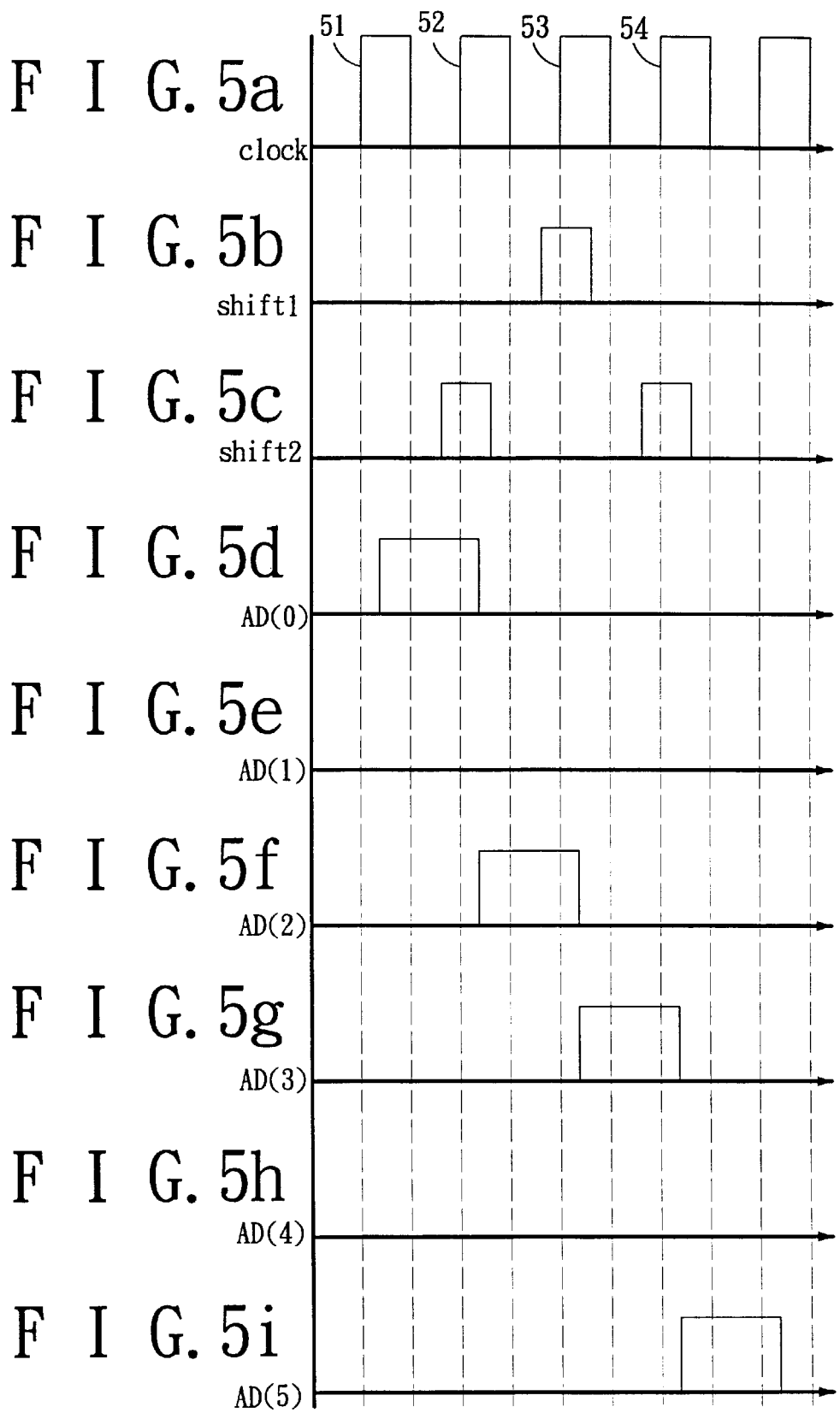

FIG. 6a Clock'

FIG. 6b shift1'

FIG. 6c shift2'

FIG. 6d selected address pointer: AD(j-1), AD(j), AD(j+2), AD(j+3), AD(j+4), AD(j+5), AD(j+7), AD(j+9), (j+10)

MULTI-SHIFTING SHIFT REGISTER

BACKGROUND OF THE INVENTION

1. Field of the Invention

The invention relates to a shift register, more particularly to a multi-shifting shift register.

2. Description of the Related Art

FIG. 1 illustrates a conventional shift register for outputting a selected address signal to a memory array (not shown). The selected address signal is capable of enabling a corresponding word line of the memory array for data storage and access. The conventional shift register includes a plurality of ring-cascaded D-type flip-flops. In this example, there are four D-type flip-flops (DEF0, DEF1, DEF2, DEF3). Each of the flip-flops (DEF0, DEF1, DEF2, DEF3) has an input (D), a timing pulse signal input (T) for receiving a timing pulse signal (Clock), and an output (Q) for generating an address signal (AD(0), AD(1), AD(2), AD(3)). The input of each of the flip-flops (DEF0, DEF1, DEF2, DEF3) is connected to the output (Q) of a preceding one of the flip-flops (DEF0, DEF1, DEF2, DEF3). Due to a positive-edge triggering action (i.e. logic-low to logic-high transition) of the time pulse signal (Clock), the address signal previously received by the input (D) of each flip-flop is outputted at the output (Q) of the same.

Before the conventional shift register starts working, each of the flip-flops (DFF0, DFF1, DFF2, DFF3) should be reset. During a first cycle 11 of the timing pulse signal (Clock), a logic-high reset signal (Reset) (see FIG. 2b) is received by the flip-flops (DFF0, DFF1, DFF2, DFF3) for clearing data therein such that only the address signal (AD(0)) outputted at the output (D) of the first flip-flop (DFF(0)) is at a logic-high state, as shown in FIG. 2c, and such that the other address signals (AD(1), AD(2), AD(3)) are at a logic-low state. During a second cycle 12 of the timing pulse signal (Clock), the logic-high address signal (AD(0)) received by the input (D) of the second flip-flop (DFF1) is outputted at the output (Q) of the second flip-flop (DFF1) such that the address signal (AD(1)) is at the logic-high state, as shown in FIG. 2d. During a third cycle 13 of the timing pulse signal (Clock), the address signal (AD(2)) outputted at the output (Q) of the third flip-flop (DFF2) is at the logic-high state, and the other address signals (AD(0), AD(1), AD(3)) are at the logic-low state. During a fourth cycle 14 of the timing pulse signal (Clock), the address signal (AD(3)) outputted at the output (Q) of the fourth flip-flop (DFF3) is at the logic-high state, and the other address signals (AD(0), AD(1), AD(2)) are at the logic-low state. Therefore, the selected address signal outputted by the conventional shift register is shifted by only one position during each cycle of the timing pulse signal (Clock).

Thus, according to the conventional shift register, when the selected address signal is required to be shifted by two positions, an operation time equal to two cycles of the timing pulse signal (Clock) is necessary, thereby resulting in a time delay.

SUMMARY OF THE INVENTION

Therefore, the object of the present invention is to provide a multi-shifting shift register that is capable of outputting a selected address signal to a memory unit with minimal time delay as compared to the aforesaid prior art.

According to the present invention, a multi-shifting shift register is adapted for outputting a selected address signal to a memory unit, and comprises:

a control circuit for outputting a number (i) of shift signals and a timing pulse signal, wherein one of the shift signals is at an enabled state and the other ones of the shift signals are at a disabled state during each cycle of the timing pulse signal; and a multi-shifting circuit including a number (N) of cascaded register units, the number (N) being larger than the number (i), each of the register units having a flip-flop and a selector, the flip-flop having an input end, and an output end for generating an address signal, the selector having the number (i) of select inputs that receive the number (i) of the shift signals respectively from the control circuit, the number (i) of address signal inputs, and an output, the output end of the flip-flop being connected to a first one of the address signal inputs of the selector, the input end of the flip-flop of each of the register units being connected to the output of the selector of a preceding one of the register units, a $j^{th}$ one of the address signal inputs of the selector of each of the registers units being connected to the output end of the flip-flop of a $(j-1)^{th}$ preceding one of the register units, the number (j) being a number between 2 and I, wherein when a $k^{th}$ one of the shift signals that are received at said select inputs of the selector is at the enabled state during a cycle of the timing pulse signal, the selector provides the signal, which is received at a $k^{th}$ one of the address signal inputs, at the output thereof, the number (k) being a number between 1 and i;

the selected address signal being the address signal that is outputted by the flip-flop of one of the register units and that is at the enabled state.

BRIEF DESCRIPTION OF THE DRAWINGS

Other features and advantages of the present invention will become apparent in the following detailed description of the preferred embodiment with reference to the accompanying drawings, of which:

FIG. 1 is a schematic electrical circuit diagram illustrating a conventional shift register;

FIGS. 2a to 2f are timing diagrams of a timing pulse signal (Clock), a reset signal (Reset), and first to fourth address signals (AD(0), . . . ,AD(3)), respectively, of the conventional shift register of FIG. 1;

FIG. 4 is a schematic electrical circuit diagram illustrating a multi-shifting circuit of the preferred embodiment with six ring-cascaded register units;

FIGS. 5a to 5i are timing diagrams of a timing pulse signal (clock), first and second shift signals (shift1, shift2), and first to sixth address signals (AD(0), . . . ,AD(5)), respectively, for the multi-shifting circuit of FIG. 4; and FIGS. 6a to 6d are timing diagrams of a timing pulse signal (clock'), first and second shift signals (shift1', shift2'), and an address pointer, respectively, of another operating example of the preferred embodiment.

DETAILED DESCRIPTION OF THE PREFERRED EMBODIMENT

Figure 3:
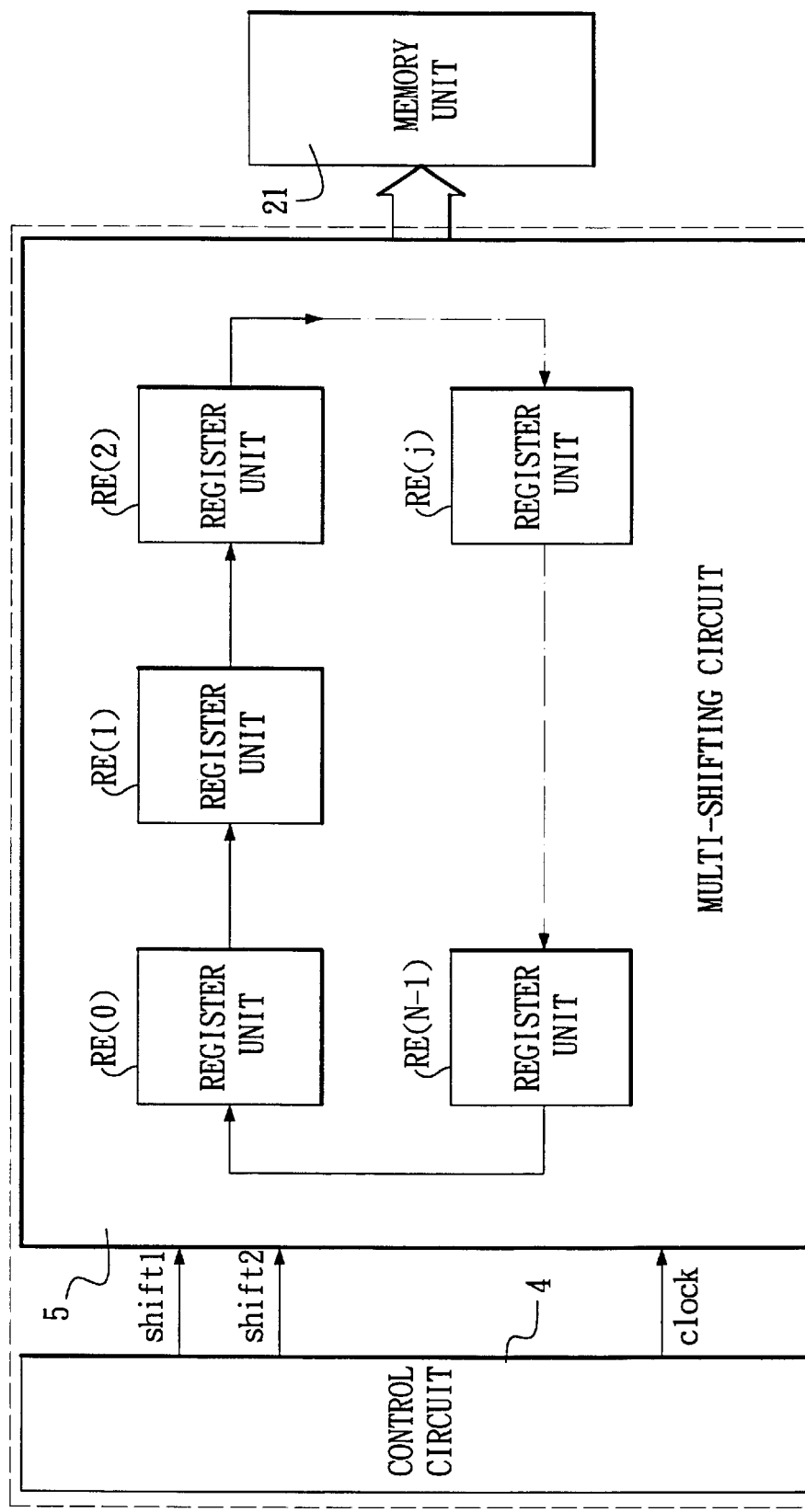
FIG. 3 is a schematic circuit block diagram illustrating the preferred embodiment of a multi-shifting shift register according to the present invention.

Referring to FIG. 3, according to the preferred embodiment of the present invention, a multi-shifting shift register 3 is shown to be adapted for outputting a selected address signal to a memory unit 21. The selected address signal is capable of enabling at least one corresponding word line of a memory array (not shown) of the memory unit 21 for data storage and access. The multi-shifting shift register 3 includes a control circuit 4, and a multi-shifting circuit 5.

The control circuit 4 is adapted to receive an external timing pulse signal, and a plurality of external signals that decide different shift numbers. The control circuit 4 includes a flip-flop (not shown) for latching the external signals, and a buffer (not shown) for enhancing driving capability thereof so as to output a number (i) (in this embodiment, the number (i) is equal to two) of shift signals (shift1, shift2) and a timing pulse signal (clock), wherein one of the shift signals (shift1, shift2) is at an enabled state and the other one of the shift signals (shift1, shift2) is at a disabled state during each cycle of the timing pulse signal (clock). In this embodiment, the enabled state is a logic-high state, and the disabled state is a logic-low state. The shift signals (shift1, shift2) have a positive triggering edge that occurs prior to a corresponding cycle of the timing pulse signal (clock) (see FIGS. 5a to 5c).

The multi-shifting circuit 5 includes a number (N) of ring-cascaded register units (RE(0), RE(1), ..., RE(N–1)). The number (N) is larger than the number (i) In this embodiment, the number (N) is equal to six. Referring to FIG. 4, each of the register units (RE(0) RE(1), ..., RE(5)) includes a D-type flip-flop (DFF(0) DFF(1), ..., DFF(5)) and a selector (SEL(0), SEL(1) SEL(5)). Each of the flip-flops (DFF(0), DFF(1), ..., DFF(5)) has an input end (D), and an output end (Q) for generating an address signal (AD (0), AD (1), ..., AD (5)) Each of the selectors (SEL(0), SEL(1), ..., SEL(5)) has the number (i) of select inputs (select1, select2) that receive the number (i) of the shift signals (shift1, shift2) respectively from the control circuit 4, the number (i) of address signal inputs (input1, input2) and an output. In each register unit, the output end (Q) of the flip-flop (DFF(0), DFF(1), ..., DFF(5)) is connected to a first one of the address signal inputs (input1, input2) of the selector (SEL(0), SEL(1), ..., SEL(5)) The input end (D) of the flip-flop (DFF((0) DFF(1), ..., DFF(5)) of each of the register units (RE(0), RE(1), ..., RE(5)) is connected to the output of the selector (SEL(0), SEL(1), ..., SEL(5)) of a preceding one of the register units (RE(0), RE(1), ..., RE(5)). A second one of the address signal inputs (input1, input2) of the selector (SEL(0), SEL(1), ..., SEL(5)) of each of the register units (RE(0), RE(1), ..., RE(5)) is connected to the output end (Q) of the flip-flop (DFF(0), DFF(1), ..., DFF (5)) of a preceding one of the register units (RE(0), RE(1), ..., RE(5)). When the first shift signal (shift1) received at the first select input (select1) is at the logic-high state during a cycle of the timing pulse signal (clock), each of the selectors (SEL(0), SEL(1), ..., SEL(5)) provides the signal, which is received at the first address signal input (input1), at the output thereof. Accordingly, when the second shift signal (shift2) received at the second select input (select2) is at the logic-high state during a cycle of the timing pulse signal (clock), each of the selectors (SEL(0), SEL(1), ..., SEL(5)) provides the signal, which is received at the second address signal input (input2), at the output thereof.

The selected address signal is the address signal (AD(0), AD(1), ..., AD(5)) that is outputted by the flip-flop (DFF(0), DFF(1), ..., DFF(5)) of one of the register units (RE(0), RE(1), ..., RE(5)) and that is at the logic-high state.

FIGS. 5a to 5i illustrate an operating example using the preferred embodiment of FIG. 4. Before the multi-shifting shift register 3 starts working, each of the flip-flops (DFF(0), DFF(1), ..., DFF(5)) should be reset. During a first cycle 51 of the timing pulse signal (clock), data in the flip-flops (DFF(0), DFF(1), ..., DFF(5)) are cleared such that only the address signal (AD(0)) outputted at the output end (D) of the first flip-flop (DFF(0)) is at the logic-high state, as shown in FIG. 5d, and such that the other address signals (AD(1), ..., AD(5)) are at the logic-low state. Therefore, the logic-high address signal (AD(0)) is received by the first address signal input (input1) of the first selector (SEL(0)), and the second address signal input (input2) of the second selector (SEL(1)).

During a second cycle 52 of the timing pulse signal (clock), since the second shift signal (shift2) is at the logic-high state (see FIG. 5c), the selector (SEL(0), SEL(1), ..., SEL(5)) of each of the register units (RE(0), RE(1), ..., RE(5)) outputs the signal, which is received at the second address signal input (input2), to the input end (D) of the flip-flop (DFF(0) DFF(1) ..., DFF(5)) of a next one of the register units (RE(0), RE(1), ..., RE(5)). As such, only the input end (D) of the third flip-flop (DFF(2)) receives the logic-high address signal (AD(0)) such that the address signal (AD(2)) outputted by the third flip-flop (DFF(3)) is at the logic-high state, as shown in FIG. 5f. The selected address signal is the logic-high address signal (AD(2)).

Thereafter, during a third cycle 53 of the timing pulse signal (clock), since the first shift signal (shift1) is at the logic-high state (see FIG. 5b), the input end (D) of the fourth flip-flop (DFF(3)) receives the logic-high address signal (AD(2)) such that the selected address signal becomes the address signal (AD(3)), as shown in FIG. 5g. Finally, during a fourth cycle 54 of the timing pulse signal (clock) since the second shift signal (shift2) is at the logic-high state (see FIG. 5c), the selected address signal becomes the address signal (AD(5)), as shown in FIG. 5i.

It is noted that the selected address signal can be shifted from AD(0) to AD(2) or from AD(3) to AD(5) in only one cycle of the timing pulse signal (clock) thereby resulting in a shorter operation time for outputting the selected address signal. The object of the invention is thus met.

FIGS. 6a to 6d illustrate another operating example of the preferred embodiment of FIG. 3. Assuming that the multi-shifting circuit 5 outputs an original address signal (AD(j–1)) as the selected address signal to the memory unit 21, according to the first and second shift signals (shift1', shift2') during a first cycle of the timing pulse signal (clock'), due to the logic-high first shift signal (shift1'), the selected address signal is shifted from AD(j–1) to AD(j). During a second cycle of the timing pulse signal (clock'), due to the logic-high second shift signal (shift2'), the selected address signal is shifted from AD(j) to AD(j+2). As shown in FIG. 6d, during third to fifth cycles of the timing pulse signal (clock'), due to the logic-high first shift signal (shift1'), the selected address signal is shifted to AD(j+3), AD(j+4) and AD(j+5), respectively. During sixth and seventh cycles of the timing pulse signal (clock'), due to the logic-high second shift signal (shift2'), the selected address signal is shifted to AD(j+7) and AD(j+9) respectively.

It is noted that when the number (i) of the preferred embodiment is equal to three, the selected address signal can be shifted by up to three position during each cycle of the timing pulse signal.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A multi-shifting shift register adapted for outputting a selected address signal to a memory unit, said multi-shifting shift register comprising:

a control circuit for outputting a number (i) of shift signals and a timing pulse signal, wherein one of the shift signals is at an enabled state and the other ones of the shift signals are at a disabled state during each cycle of the timing pulse signal; and a multi-shifting circuit including a number (N) of cascaded register units, the number (N) being larger than the number (i), each of said register units having a flip-flop and a selector, said flip-flop having an input end, and an output end for generating an address signal, said selector having the number (i) of select inputs that receive the number (i) of the shift signals respectively from said control circuit, the number (i) of address signal inputs, and an output, said output end of said flip-flop being connected to a first one of said address signal inputs of said selector, said input end of said flip-flop of each of said register units being connected to said output of said selector of a preceding one of said register units, a $j^{th}$ one of said address signal inputs of said selector of each of said registers units being connected to said output end of said flip-flop of a $(j-1)^{th}$ preceding one of said register units, the number (j) being a number between 2 and i, wherein when a $k^{th}$ one of the shift signals that are received at said select inputs of said selector is at the enabled state during a cycle of the timing pulse signal, said selector provides the signal, which is received at a $k^{th}$ one of said address signal inputs, at said output thereof, the number (k) being a number between 1 and i;

the selected address signal being the address signal that is outputted by said flip-flop of one of said register units and that is at the enabled state.

2. The multi-shifting shift register of claim 1, wherein said flip-flop is a D-type flip-flop.

3. The multi-shifting shift register of claim 1, wherein the enabled state is a logic-high state, and the disabled state is a logic-low state.

* * * * *